(12) United States Patent
Tian et al.

(10) Patent No.: US 10,779,436 B2
(45) Date of Patent: Sep. 15, 2020

(54) SPACE-EFFICIENT PRESSURE RELIEF MECHANISM FOR IMMERSION COOLING OF COMPUTING ELEMENTS

(71) Applicant: International Business Machines Corporation, Armonk, NY (US)

(72) Inventors: Shurong Tian, Mount Kisco, NY (US); Todd E. Takken, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/593,624

(22) Filed: Oct. 4, 2019

(65) Prior Publication Data

US 2020/0037469 A1  Jan. 30, 2020

Related U.S. Application Data

(63) Continuation of application No. 15/854,986, filed on Dec. 27, 2017, now Pat. No. 10,568,236.

(51) Int. Cl.
*H05K 7/20* (2006.01)
*G06F 1/20* (2006.01)

(52) U.S. Cl.
CPC .......... *H05K 7/20327* (2013.01); *G06F 1/20* (2013.01); *H05K 7/203* (2013.01); *H05K 7/20318* (2013.01)

(58) Field of Classification Search
CPC ...... G06F 1/20; H05K 7/203; H05K 7/20327; H05K 7/20318
See application file for complete search history.

(56) References Cited

U.S. PATENT DOCUMENTS

| 5,206,791 A | 4/1993 | Novotny |
| 9,596,787 B1* | 3/2017 | Iyengar .................. H05K 7/203 |
| 9,936,606 B1* | 4/2018 | Kosugi .................. C09K 5/041 |
| 2006/0007656 A1 | 1/2006 | Symons |

(Continued)

FOREIGN PATENT DOCUMENTS

| DE | 102009011201 A1 | 9/2010 |
| EP | 0445309 A1 | 9/1991 |
| WO | WO2009153583 A1 | 12/2009 |

OTHER PUBLICATIONS

Tuma, "Design Considerations Relating to Non-Thermal Aspects of Passive 2-Phase Immersion Cooling", Semiconductor Thermal Measurement and Management Symposium, 27th IEEE Semi-Therm Symposium, Mar. 20, 2011, 9 pages.

(Continued)

*Primary Examiner* — Jacob R Crum
(74) *Attorney, Agent, or Firm* — Scully, Scott, Murphy & Presser, P.C.; Daniel Morris, Esq.

(57) ABSTRACT

A cooling apparatus includes a chamber and a pressure-relief element. The chamber includes a coolant in a liquid phase disposed near a heat-generation object. The coolant in the liquid phase dissipates heat from the heat-generation object and is converted from the liquid phase to a vapor phase upon the coolant in the liquid phase reaching a boiling temperature. The pressure-relief element has a conduit. A first end of the conduit is submerged in the coolant in the liquid phase internal to the chamber and a second end of the conduit is connected to atmosphere external to the chamber.

14 Claims, 7 Drawing Sheets

(56) References Cited

U.S. PATENT DOCUMENTS

| | | | |
|---|---|---|---|
| 2006/0007657 A1* | 1/2006 | Pfahnl | H05K 7/20327 |
| | | | 361/700 |
| 2007/0193300 A1 | 8/2007 | Tilton et al. | |
| 2007/0230116 A1 | 10/2007 | Myers et al. | |
| 2014/0218859 A1 | 8/2014 | Shelnutt et al. | |
| 2015/0062806 A1 | 3/2015 | Shelnutt et al. | |
| 2017/0295670 A1 | 10/2017 | Campbell et al. | |
| 2017/0303434 A1 | 10/2017 | Katsumata et al. | |
| 2018/0020570 A1 | 1/2018 | Fujiwara et al. | |
| 2019/0014685 A1* | 1/2019 | So | H05K 7/20809 |

OTHER PUBLICATIONS

Tuma, "Open Bath Immersion Cooling: Density, Efficiency and Simplicity", In Presentation, Le Palais de Congres de Paris, Jun. 5, 2012, 28 pages.

List of IBM Patents or Patent Applications Treated As Related.

* cited by examiner

SPACE-EFFICIENT PRESSURE RELIEF MECHANISM FOR IMMERSION COOLING OF COMPUTING ELEMENTS

FIELD

The present disclosure relates to a cooling system for computing elements, more particularly to a two-phase immersion cooling mechanism for preventing an escape of a coolant from the cooling system.

BACKGROUND

As power density of chips in computing elements gets higher, traditional water cooling schemes require more complex and costly cooling structures to remove the heat from the chips. They also require more cooling spaces to accommodate such complex cooling structures. There are some water cooling systems based on indirect-water contact schemes, however, they require multi-layers of thermal interface materials to limit cooling efficiency.

Immersion cooling schemes have been developed to eliminate the thermal interface materials and the associated complex cooling structures, so computing elements can be arranged more compactly. These schemes take advantage of boiling two phase transfer, however, when a coolant in a liquid phase boils to generate a large amount of vapor, a vapor pressure level may increase to cause a portion of the vapor to escape from an immersion cooling system.

SUMMARY

In an aspect of the present disclosure, a cooling apparatus is provided. The cooling apparatus includes a chamber and a pressure-relief element. The chamber includes a coolant in a liquid phase disposed near one or more heat-generation objects. The coolant in the liquid phase dissipates heat from the one or more heat-generation objects to be converted from the liquid phase to a vapor phase upon the coolant in the liquid phase reaching a boiling temperature. The pressure-relief element includes a conduit. A first end of the conduit is submerged into the coolant in the liquid phase internal to the chamber and a second end of the conduit is connected to atmosphere external to the chamber.

In another aspect of the present disclosure, a cooled electronic system is provided. The cooled electronic system includes at least one electronic circuit board and a cooling apparatus. The at least one electronic circuit board includes one or more electronic components. The cooling apparatus is configured to cool the one or more electronic components. The cooling apparatus includes a chamber and a pressure-relief element. The chamber includes a coolant in a liquid phase disposed near the at least one electronic circuit board. The coolant in the liquid phase dissipates heat from the at least one electronic circuit board to be converted from the liquid phase to a vapor phase upon the coolant in the liquid phase reaching a boiling temperature. The pressure-relief element includes a conduit. A first end of the conduit is submerged in the coolant in the liquid phase and a second end of the conduit is connected to atmosphere.

BRIEF DESCRIPTION OF THE DRAWINGS

FIGS. 3A, 3B and 3C depict respective cross-sectional close-up views of an immersion cooling system when a pressure-relief element is implemented having a first open end of the pressure-relief element internal to the chamber and a second end of the pressure-relief element open to the atmosphere external to the chamber, with no barrier between the cooling fluid and external air, according to an embodiment of the present disclosure and wherein

FIGS. 4A, 4B and 4C correspond to the embodiments of FIGS. 3A, 3B and 3C respectively showing a detailed cross-sectional view of an immersion cooling system when a mobile barrier of a pressure-relief element is implemented by having a solid or liquid layer floating on the surface of the cooling fluid within the pressure relief element, thereby preventing evaporation of the fluid, according to an embodiment of the present disclosure and wherein

FIGS. 5A, 5B and 5C correspond to the embodiments of FIGS. 3A, 3B and 3C respectively showing detailed cross-sectional views of an immersion cooling system employing a flexible membrane barrier within or at the end of the pressure relief element, thereby preventing evaporation of the fluid, according to an embodiment of the present disclosure and wherein

FIGS. 7A, 7B and 7C show respective detailed cross-sectional views of an immersion cooling system of FIG. 6 employing the pressure relief element and barrier of FIG. 6 having a variable cross section, wherein the barrier in the pressure-relief element is implemented by having a solid or liquid layer floating on the surface of the cooling fluid within the pressure relief element, permitting the pressure relief element to adjust for greater volume expansion inside the chamber and wherein

DETAILED DESCRIPTION OF THE EMBODIMENTS

Embodiments of the present disclosure will now be described in detail on the basis of the drawings. However, the following embodiments do not restrict the invention claimed in the claims. Moreover, all combinations of features described in the embodiments are not necessarily mandatory for the architecture of the present disclosure. Like numbers are assigned to like elements throughout the description of the embodiments of the present disclosure.

The present disclosure provides a two-phase immersion cooling system based on a space-efficient pressure-relief element, for use when heat-generation objects heat are cooled by a phase-change, immersion cooling mechanism. The heat-generation objects can be cooled by immersing them into a bath of a dielectric coolant (e.g., cooling fluid). The heat-generation objects may transfer heat generated by the heat-generation objects into the coolant in a liquid phase and boil the liquid-phase coolant, thereby converting the coolant from the liquid phase to a vapor phase. In the present disclosure, the term "heat-generation objects" may refer to objects generating heat including, but are not limited to: computing elements such as computing processors, computing servers, electronic circuit boards, one or more electronic components included therein, etc. The vapor-phase coolant converted from the liquid-phase coolant may move toward a condenser.

In one embodiment, the condenser is located in an immersion cooling chamber, and configured to remove heat from the vapor-phase coolant and convert back the coolant from the vapor phase to the liquid phase. For example, the condenser according to an embodiment is submerged into the coolant in the liquid phase. A fraction of the coolant molecules in the vapor phase may vary somewhat along with an amount of heat generated by the heat-generation objects.

For example, the number of the vapor-phase coolant molecules may increase as the amount of heating generated by the heat-generation objects increases, or vice versa. If the condenser is designed with a high enough capacity so that it is capable of converting the vapor-phase coolant molecules to a liquid faster than the maximal rate at which vapor-phase coolant molecules can be generated by the heat-generation objects, then the number and volume of the vapor-phase coolant molecules inside the chamber will not increase substantially. As heat generation increases the number and volume of vapor bubbles will increase between the heat generation elements and the condenser. However, since the condenser is capable of condensing all arriving vapor bubbles, the amount and volume of vapor in the chamber will only grow moderately and will be limited. In one embodiment, a pressure of the coolant in the vapor phase inside the chamber maintained at or below one atmospheric pressure. One embodiment of an enhanced condenser 30 is shown in an expanded view in FIG. 1. By putting fins 33 around the fluid carrying section 32 of the condenser, the condenser surface area can be expanded. This improves the condenser's efficiency and its ability to convert vapor into fluid.

The increase in the number of the vapor-phase coolant molecules inside the chamber may cause an increase in volume of the vapor molecules and in density of the molecules for a given volume of space (e.g., cooling chamber), thereby increasing a pressure level inside the chamber and resulting in a loss of the coolant along with time. In one embodiment, a pressure-relief element is used to compensate for the volume change in the vapor-phase coolant molecules to prevent loss of the coolant from the cooling system.

Figure 1:
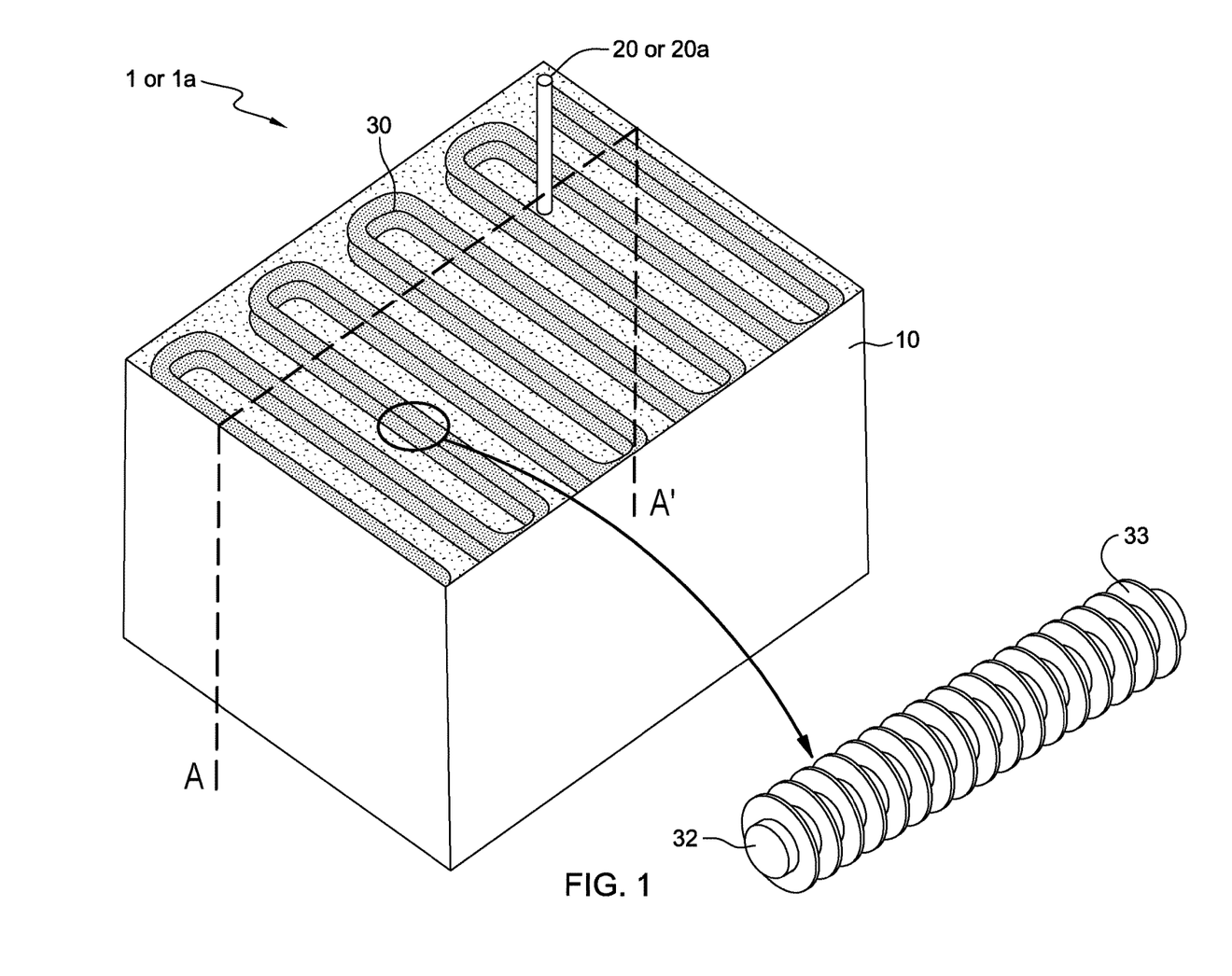
FIG. 1 depicts a perspective view of an example immersion cooling system for cooling one or more heat-generation objects according to an embodiment of the present disclosure.
Figure 2:
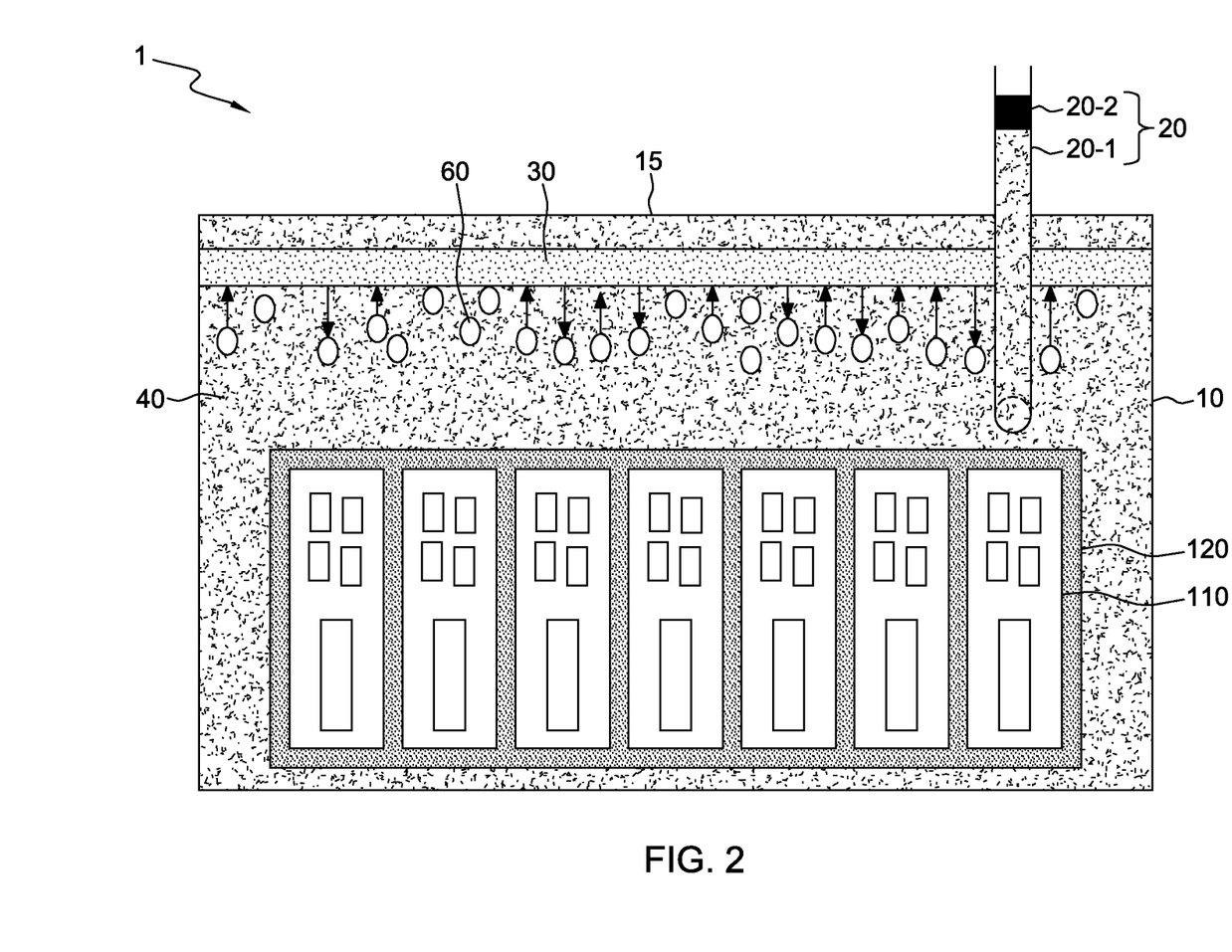
FIG. 2 depicts a cross-sectional view of the immersion cooling system, which is taken along lines A-A' of FIG. 1 according to an embodiment of the present disclosure.

FIG. 1 depicts a perspective view of an example immersion cooling system 1 for cooling one or more heat-generation objects according to an embodiment of the present disclosure. FIG. 2 depicts a cross-sectional view of the immersion cooling system 1, which is taken along lines A-A' of FIG. 1, according to an embodiment of the present disclosure. As depicted in FIG. 2, a pressure-relief element 20 is provided in the cooling chamber 10.

Referring to FIGS. 1 and 2, examples of the heat-generation objects to be cooled include one or more electronic circuit boards 110 (e.g., printed circuit boards or integrated circuit chips) which may be located at a certain section in the cooling chamber 10 and a coolant in the liquid phase 40 (which is hereinafter referred to as "liquid-phase coolant 40") are disposed to surround or near the heat-generation objects 110. The terms liquid-phase coolant 40 or liquid-phase coolant molecules 40 can be used interchangeably in the present disclosure. The heat-generation objects 110 may be mounted on one or more racks 120 in a vertical direction as depicted in FIG. 2. However, it should be appreciated that an example configuration of FIG. 2 is intended to be illustrative only and embodiment of the present disclosure are not limited thereto. For example, the heat-generation objects (e.g., the one or more electronic circuit boards) may be mounted on the one or more racks in a horizontal direction to stack on each other in the vertical direction. The liquid-phase coolant 40 absorbs the heat generated by the heat-generation objects 110 and boils thus to be converted from the liquid phase to a vapor phase 60 or coolant in a vapor phase (which is hereinafter referred to as "vapor-phase coolant") when temperature thereof exceeds a certain boiling temperature. The terms vapor-phase coolant 60 or vapor-phase coolant molecules 60 can be used interchangeably in the present disclosure. The converting of the liquid-phase coolant 40 to the vapor-phase coolant 60 may be understood as the liquid-phase coolant 40 evaporating to a vapor phase. For example, the coolant includes dielectric materials. The boiling temperature may be set depending on a sort of the materials forming the coolant. An example of the coolant is a dielectric coolant. However, the cooling concepts disclosed herein are readily adapted to use with other types of coolant. For example, the coolant may be implemented using non-limiting examples of dielectric fluids that share at least one of following properties: non-corrosive, not electrically conducting, not hazardous to human health, having a boiling temperature at one atmosphere that is in a device operation temperature range (e.g., 25° C. to 85° C.), environmentally friendly (e.g., not contributing to global warming), etc. Example cooling fluids include 3M Novec 649 or 3M Novec 7000, or similar fluids from other manufacturers.

In addition, as depicted in FIG. 2, the immersion cooling system 1 includes the condenser 30 and a pressure-relief element 20. In a state (e.g., initial state) where the liquid-phase coolant molecules 40 do not boil as temperature of the heat-generation objects 110 is below a predetermined temperature value (e.g., a boiling temperature), vapor-phase coolant molecules 60 are not generated, so that the condenser 30 may be surrounded primarily by the liquid-phase coolant molecules 40. When the temperature of the heat-generation objects 110 exceeds the predetermined temperature value, the vapor-phase coolant molecules 60 may be generated and may move toward the condenser 30. The condenser 30 is configured to condense (or remove) the heat from the vapor-phase coolant 60 and convert the coolant back to the liquid phase 40. Although it is illustrated in FIGS. 1 and 2 that the condenser 30 is located in a top section of the chamber 10, exemplary embodiments of the present disclosure are not limited thereto. In one embodiment, the chamber 10 is also filled with the coolant (e.g., 40 or 60) with no vapor region therein, so that the condenser 30 is submerged into the coolant. In one embodiment, the cooling chamber 10 is sealed by a top cover 15.

In one embodiment, the condenser 30 may be a heat removal device maintained at a constant low temperature by various means including a forced cool air or cool liquid (e.g., water) therein. The detailed structures and schemes for implementation of the condenser 30 are well known to those skilled in the art, and are not the main parts of the present disclosure, and thus are not described herein.

As depicted in FIG. 2, the pressure-relief element 20 includes a conduit 20-1 (e.g., a tube) and a barrier 20-2. The conduit 20-1 is formed to extend between inside and outside of the chamber 10. To this end, the chamber 10 or each of the chamber 10 and the condenser 30 is configured to include an aperture (or a hole) where a portion of the pressure-relief element 20 can be placed. For example, a first end (e.g., a bottom portion) of the conduit 20-1 is open-ended and submerged in the liquid-phase coolant 40 inside the cooling chamber 10 and a second end (e.g., a top portion) of the conduit 20-1 is connected to atmosphere external to the chamber. The second end of the conduit 20-1 may be located outside the chamber 10 to face the atmosphere. The barrier 20-2 is formed on the second end of the conduit 20-1 to separate an inside of the conduit 20-1 from the external atmosphere, thus preventing evaporation of the liquid-phase coolant 40 and further minimizing loss of the liquid-phase coolant 40. In one embodiment, the barrier 20-2 includes a nonvolatile solid or liquid layer that can be an expandable, stretchable, such as a layer of water, a balloon, a bellows, etc., depending on an amount of volume change of the vapor-phase coolant. In one embodiment, the balloon may be made of rubber or latex and the bellow may be made of metal.

Figure 3A:
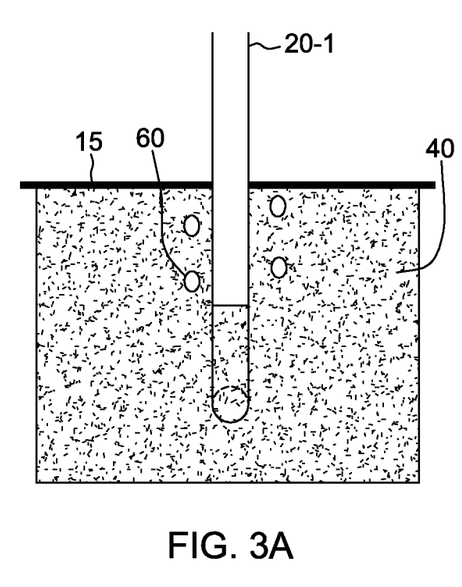
FIG. 3A depicts an operation of a pressure-relief element when an amount of heating provided by heat-generation objects is in a first range.
Figure 3B:
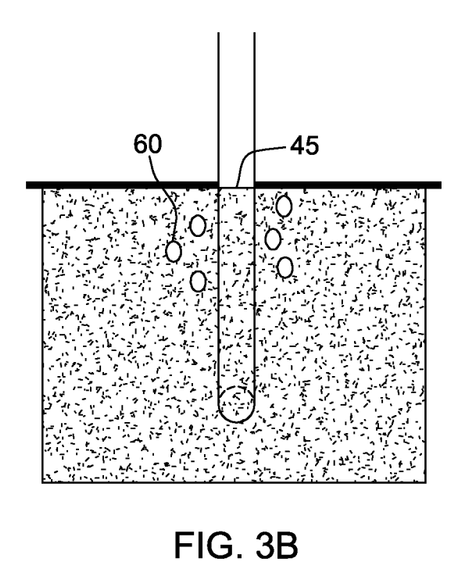
FIG. 3B depicts an operation of a pressure-relief element when an amount of heating provided by the heat-generation objects is in a second range and FIG. 3C depicts an operation of a pressure-relief element when an amount of heating provided by the heat-generation objects is in a third range according to an exemplary embodiment.
Figure 3C:
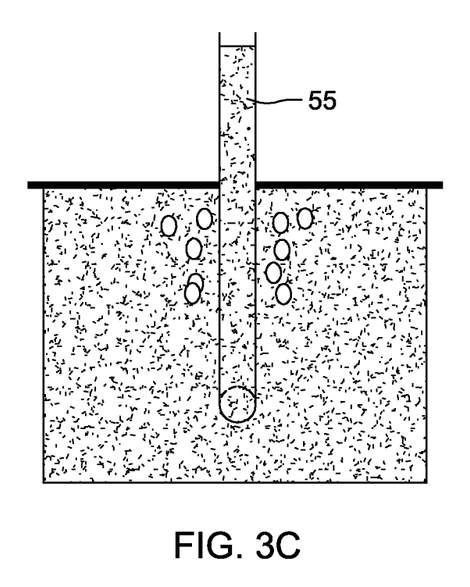

As depicted in FIG. 3, the conduit 20-1 of the pressure-relief element 20 may form an open air channel between the coolant in the liquid phase and the external atmosphere. In one such embodiment there is no barrier between liquid phase coolant and air within the pressure-relief element. Although there will be some evaporation of liquid phase cooling fluid into the air, the amount of coolant lost into the air will be limited, if the cross sectional area of the pressure-relief element is small.

As explained above, as the amount of heating provided by the heat-generation objects varies, the number of vapor-phase coolant molecules between the heat-generation objects 110 and the condenser 30 will vary. This will result in a net volume change in the vapor-phase coolant within the chamber as a function of time.

The pressure-relief element 20 serves to allow a portion of the liquid-phase coolant 40 to flow into and out of the chamber 10, without resulting in a net loss of coolant material. For example, when the heating provided by the heat-generation objects 110 increases to be higher than a predetermined amount of power (e.g., when the heating provided by the heat-generation objects 110 expands the volume of vapor and increases a pressure level inside the chamber 10 to be higher than a predetermined level (e.g., one atmospheric pressure)), the net volume of the coolant in the vapor phase is expanded and the pressure-relief element 20 allows a certain portion of the liquid-phase coolant 40 from the chamber 10 to flow out of the chamber and into the conduit 20-1. The certain portion of the liquid-phase coolant 40 to flow into the conduit 20-1 corresponds to the expansion of the volume of the coolant in the vapor phase inside the chamber. In addition, when the heating provided by the heat-generation objects 110 is decreases to be lower than the predetermined amount of power (e.g., when the heating provided by the heat-generation objects 110 decreases the volume of vapor and decreases a pressure level inside the chamber 10 to be lower than the predetermined level), the pressure-relief element 20 allows coolant fluid 40 to flow from the pressure-relief element back into the chamber 10 from the conduit 20-1.

Although, it is illustrated in FIG. 2 that a single pressure-relief element 20 is at a side of the cooling system 1, embodiments of the present disclosure are not limited thereto. In one embodiment, two or more pressure-relief elements can be located at multiple locations of the cooling system 1.

FIG. 3A depicts an operation of a pressure-relief element 20 of FIG. 2 when an amount of heating provided by the heat-generation objects 110 is in a first range, according to an exemplary embodiment of the present disclosure. FIG. 3B depicts an operation of the pressure-relief element 20 when an amount of heating provided by the heat-generation objects 110 is in a second range, according to an exemplary embodiment of the present disclosure. FIG. 3C depicts an operation of the pressure-relief element 20 when an amount of heating provided by the heat-generation objects 110 is in a third range, according to an exemplary embodiment of the present disclosure.

As depicted in FIG. 3A, when the amount of heating provided by the heat-generation objects 110 is in a first range, there will be a small rate of fluid boiling within the chamber and a small volume of vapor 60 within the chamber. Some coolant fluid will be pulled from the conduit 20-1 into the chamber, and conduit will contain less fluid.

As depicted in FIG. 3B, when the amount of heating provided by the heat-generation objects 110 is in a second range higher than the first range, there will be a larger rate of fluid boiling within the chamber and a larger volume of vapor 60 within the chamber. In this case a certain portion 45 of the liquid-phase coolant 40 will be pushed into the conduit 20-1 of the pressure-relief element 20.

As depicted in FIG. 3C, when the amount of heating provided by the heat-generation objects 110 is in a third range higher than the second range, there will be a relatively larger rate of fluid boiling within the chamber and a larger volume of vapor 60 within the chamber. In this case a certain portion 55 of the liquid-phase coolant 40 will be pushed into the conduit 20-1 of the pressure-relief element 20.

In one embodiment, the pressure-relief element 20 is designed to be large enough to contain the maximal amount of fluid that would be pushed out of the chamber in the case of the highest amount of heat generated by the heat generation elements. As long as the condenser is designed so that the maximal rate at which the condenser can convert molecules of coolant from vapor to liquid is higher than the maximal rate at which the heat generation elements boil coolant from liquid into vapor, then the volume change of vapor with the chamber will be limited, and the volume of fluid pushed into or pulled out of the pressure relief element will be limited. In one embodiment this volume change is designed to be a small fraction of the total chamber volume. In this embodiment a pressure relief element can be designed that is of limited and reasonable size. Although the condenser 30 is not illustrated for only purpose of simplicity in FIGS. 3A to 3C, exemplary embodiments of the present disclosure are not limited thereto.

Figure 4A:
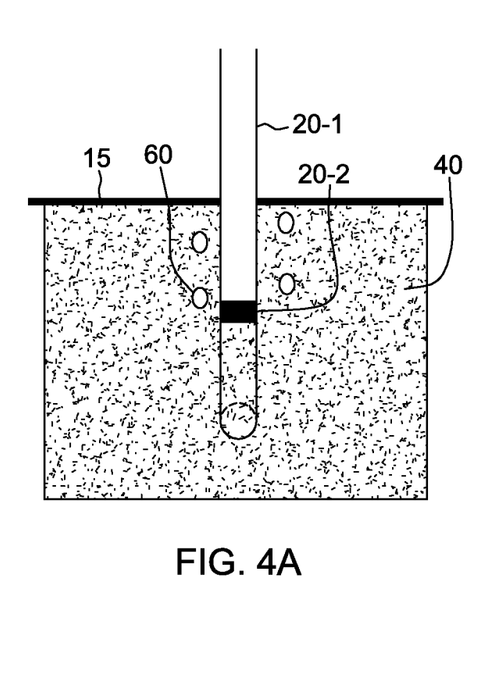
FIG. 4A depicts an operation of a pressure-relief element when an amount of heating provided by heat-generation objects is in a first range.
Figure 4B:
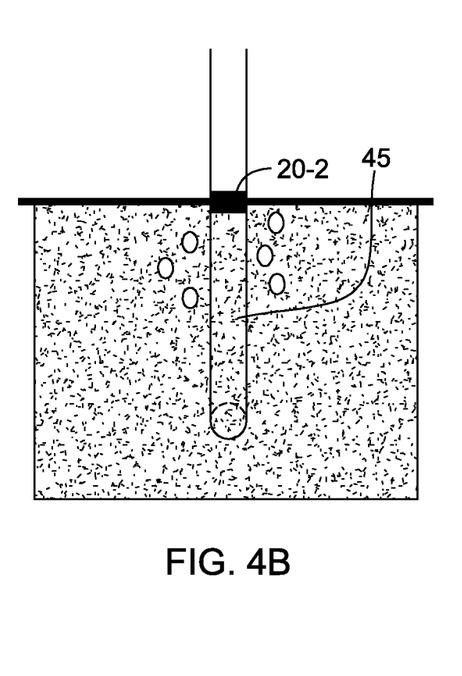
FIG. 4B depicts an operation of a pressure-relief element when an amount of heating provided by the heat-generation objects is in a second range and FIG. 4C depicts an operation of a pressure-relief element when an amount of heating provided by the heat-generation objects is in a third range.
Figure 4C:
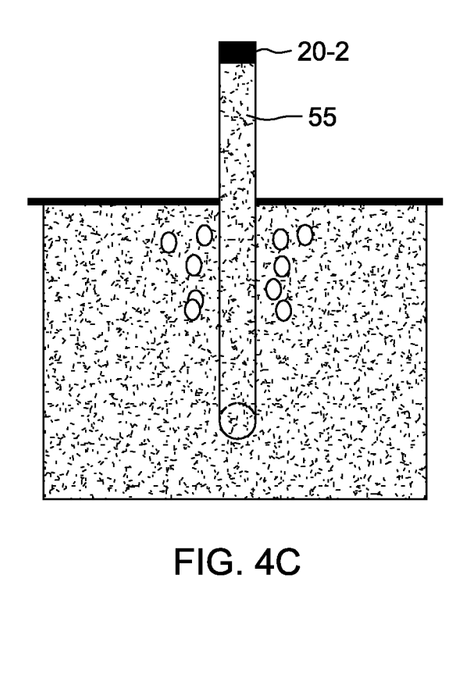

FIGS. 4A, 4B and 4C correspond to the embodiments depicted in FIGS. 3A, 3B, 3C respectively depict a cross-sectional view of an immersion cooling system 1a, which is taken along lines A-A' of FIG. 1 when a barrier 20-2 of a pressure-relief element 20 is implemented using a mobile layer floating or suspended within the pressure-relief element 20a, according to an embodiment of the present disclosure. This mobile barrier 20-2 can be solid or liquid. The barrier 20-2 helps prevent evaporation of the cooling fluid and loss of coolant molecules into the external atmosphere. Since the barrier 20-2 can move within conduit 20-1, the cooling fluid can flow into and out of the pressure relief element 20. FIG. 4A particularly depicts an operation of a pressure-relief element when an amount of heating provided by heat-generation objects is in a first range, FIG. 4B depicts an operation of a pressure-relief element when an amount of heating provided by the heat-generation objects is in a second range, greater than the first range, and FIG. 4C depicts an operation of a pressure-relief element when an amount of heating provided by the heat-generation objects is in a third range greater than the second range.

Figure 5A:
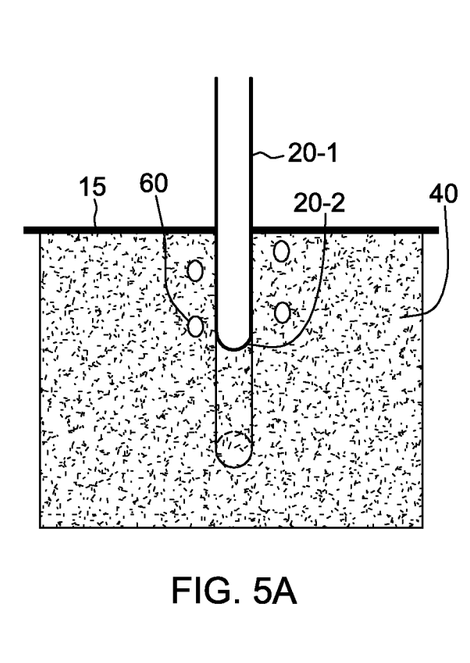
FIG. 5A depicts an operation of a pressure-relief element when an amount of heating provided by heat-generation objects is in a first range.
Figure 5B:
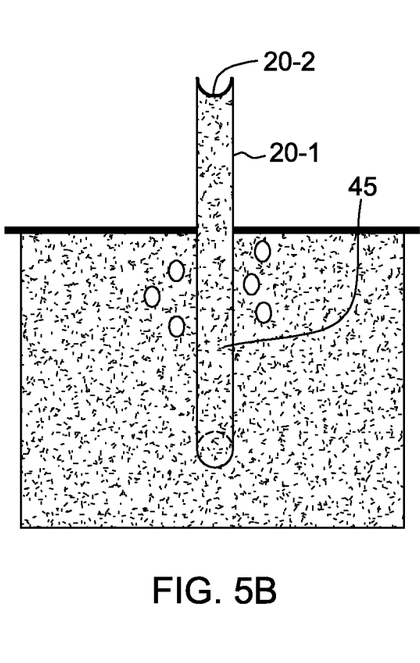
FIG. 5B depicts an operation of a pressure-relief element when an amount of heating provided by the heat-generation objects is in a second range and FIG. 5C depicts an operation of a pressure-relief element when an amount of heating provided by the heat-generation objects is in a third range.
Figure 5C:
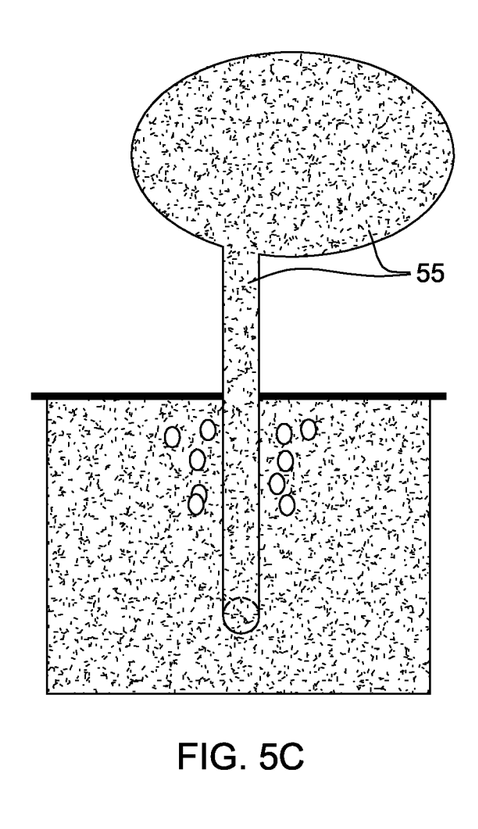

FIGS. 5A, 5B and 5C depict an operation of a pressure-relief element 20 when barrier 20-1 is formed by an expandable membrane. As shown in FIG. 5A, when heat generating objects 110 generate a first, lower amount of power and the volume of coolant vapor 60 within the chamber is lower, then membrane barrier 20-1 extends inwards. This allows an amount of fluid to flow from the pressure relief device 20 into the chamber 10, thereby maintaining the pressure inside the chamber at the same level as the external pressure. In FIG. 5B, a second larger amount of heat is generated, some fluid 45 flows from the chamber into conduit 20-1 and the membrane barrier 20-2 is not extended. In FIG. 5C, a third yet larger amount of heat is generated by heat generation devices 110 in the chamber, and more fluid 55 flows from the chamber into conduit 20-1, and the membrane barrier 20-2 extends outward to accommodate the increased fluid.

Figure 6:
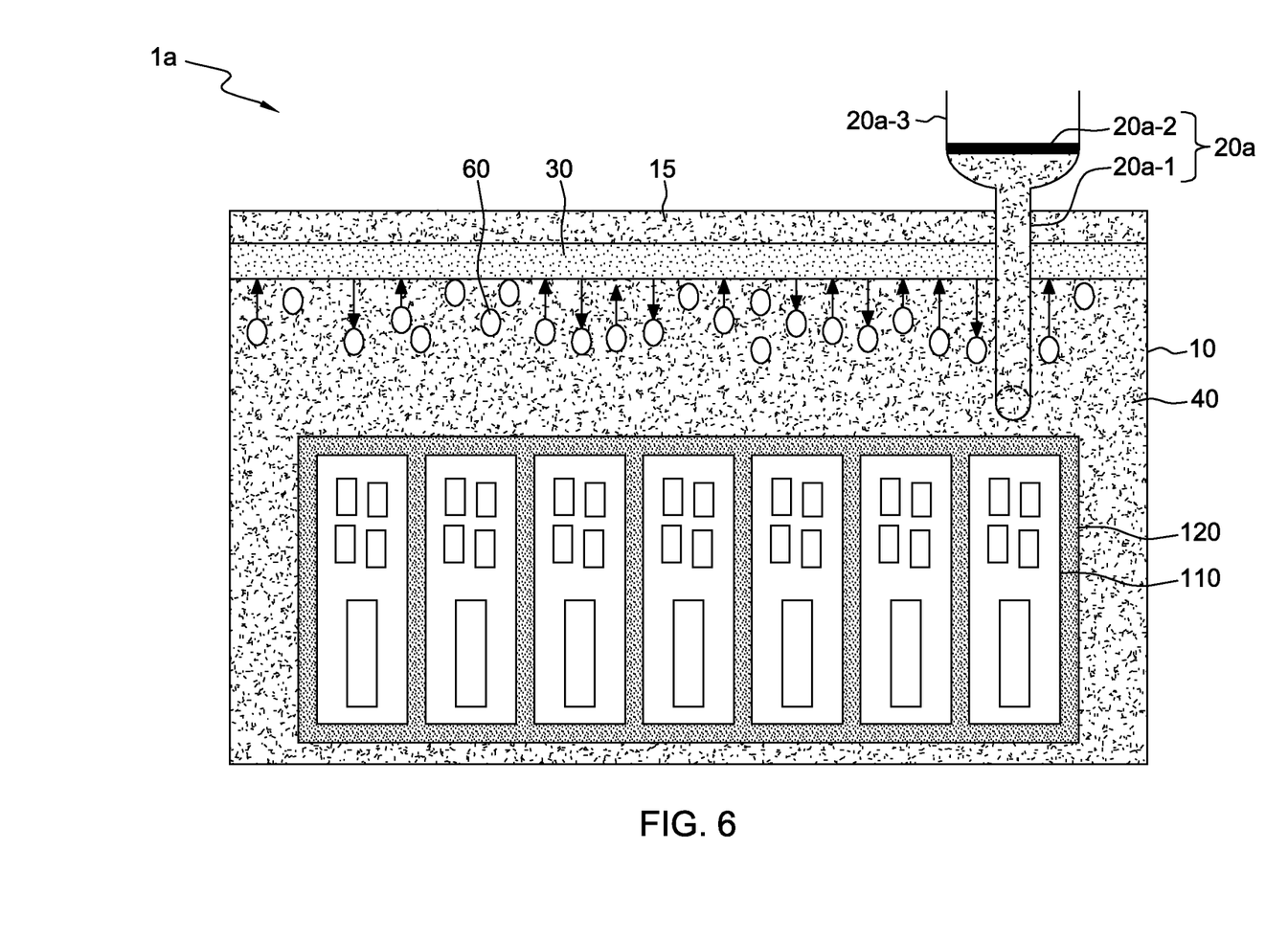
FIG. 6 depicts a cross-sectional view of an immersion cooling system, which is taken along lines A-A' of FIG. 1 according to a further embodiment, wherein a barrier of a pressure-relief element is implemented by having a solid or liquid layer floating on the surface of the cooling fluid within the pressure relief element, and where the pressure relief element and barrier have a variable cross section, thereby permitting the pressure relief element to adjust for greater volume expansion inside the chamber.

FIG. 6 depicts a cross-sectional view of an immersion cooling system 1a as described above with respect to FIG. 2. However, the embodiment of system 1a employs a pressure-relief element 20a which is a variation of the pressure relief element 20 of FIG. 1 as it is designed to have a variable cross section. In the case of FIG. 6, the pressure relief element 20a includes a conduit 20a-1 (e.g., a tube) portion and a barrier 20a-2. As shown, the cross sectional area of the pressure relieve conduit 20a-1 is expanded in a region 20a-3 where the barrier 20a-2 is to be situated. This embodiment allows the pressure relief device to handle a larger volume of fluid flow out of and into the chamber and thus into and out of the pressure control device. The configuration of the immersion cooling system 1a of FIG. 6 is otherwise substantially the same as that of the immersion cooling system 1 of FIG. 2 except for the change to pressure-relief element 20a.

Figure 7A:
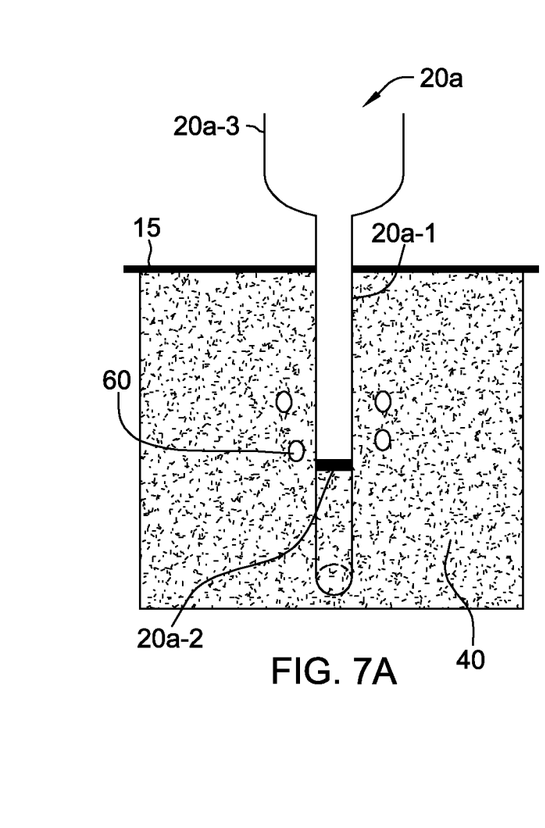
FIG. 7A depicts an operation of a pressure-relief element when an amount of heating provided by heat-generation objects is in a first range.
Figure 7B:
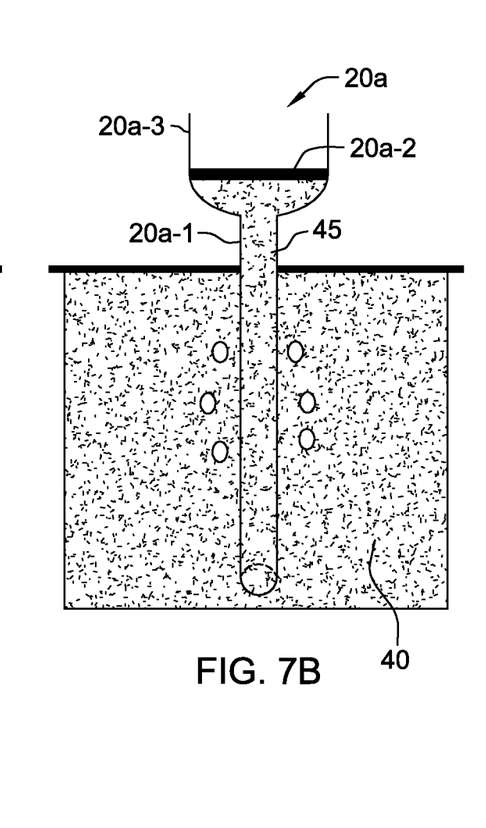
FIG. 7B depicts an operation of a pressure-relief element when an amount of heating provided by the heat-generation objects is in a second range and FIG. 7C depicts an operation of a pressure-relief element when an amount of heating provided by the heat-generation objects is in a third range.
Figure 7C:
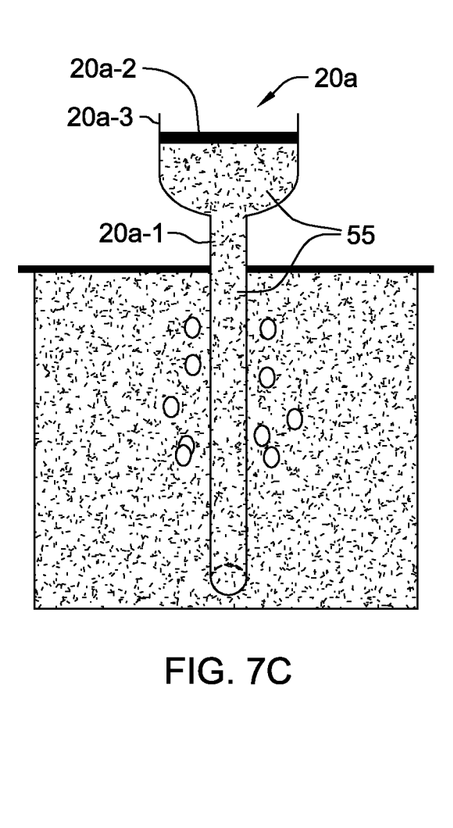

FIGS. 7A, 7B and 7C correspond to the embodiments depicted in FIGS. 3A, 3B, 3C and FIGS. 4A, 4B, 4C and depict a cross-sectional view of an immersion cooling system 1a, which is taken along lines A-A' of FIG. 1 when a barrier 20a-2 of a pressure-relief element 20a is implemented using a mobile layer floating or suspended within the pressure-relief element 20a, according to an embodiment of the present disclosure. This mobile barrier 20a-2 can be a solid or liquid layer. In one embodiment, mobile barrier may be a liquid sealant layer, e.g., a liquid which is less dense than the dielectric fluid such as water or any type of oil that doesn't mix with the dielectric fluid. The barrier 20a-2 helps prevent evaporation of the cooling fluid and loss of coolant molecules into the external atmosphere. Since the barrier 20a-2 can move within conduit portions 20a-1 and 20a-3, the cooling fluid can flow into and out of the pressure relief element 20a. FIG. 7A particularly depicts an operation of a pressure-relief element when an amount of heating provided by heat-generation objects is in a first range, FIG. 7B depicts an operation of a pressure-relief element when an amount of heating provided by the heat-generation objects is in a second range, greater than the first range, and FIG. 7C depicts an operation of a pressure-relief element when an amount of heating provided by the heat-generation objects is in a third range greater than the second range.

Referring to FIGS. 1 through 7C, in one embodiment, a first end of the pressure-relief element 20 or 20a is located at a completely liquid-phase coolant region at a distance away from regions having vapor-phase coolant molecules.

In one embodiment, given that the pressure-relief element 20 or 20a is configured to pull or push a portion of the liquid-phase coolant 40, it is relatively easy for the pressure-relief device 20 or 20a to limit loss of cooling material into the outside atmosphere. If the pressure-relief element were configured to pull or push a portion of vapor phase coolant, it would be more difficult to separate the coolant from the external atmosphere and would be more difficult to limit coolant loss over time.

In one embodiment, given that the condenser is designed to limit the variation of volume of vapor within the chamber, a required space for placing the pressure-relief element 20 can be reduced. This reduced space for the pressure-relief element 20 or 20a will be a significant improvement for evaporative immersion cooling of heat-generating electronic components. The pressure-relief element 20 or 20a according to an embodiment of the present disclosure provides an inflow or outflow of the liquid-phase coolant to and from the chamber, so as to maintain the pressure constant in the cooling chamber 10.

In one embodiment, the condenser 30 condenses the vapor-phase coolant 60 to the liquid-phase coolant 40 as a fast enough rate that a percentage volume of the vapor-phase coolant 60 remains less than a predetermined fraction of the volume inside the chamber 10. The predetermined fraction may depend on a maximum amount of volume provided by the pressure-relief element 20 or 20a because a maximum amount of volume change in the liquid phase due to the remained vapor-phase coolant molecules cannot be larger than the maximum amount of volume provided by the pressure-relief element 20 or 20a. The higher the maximum amount of volume provided by the pressure-relief element 20 or 20a is, the greater the predetermined fraction will be. For example, the efficiency of the condenser 30 for converting the vapor-phase coolant 60 to the liquid-phase coolant 40 needs to be high enough that the maximum amount of volume change in the liquid phase is smaller than the maximum amount of volume provided by the pressure-relief element 20 or 20a.

In other words, the pressure-relief element 20 or 20a is configured that its maximum amount of volume is larger than the maximum amount of volume change in the coolant in the liquid phase that could be present inside the chamber 10. In this way, the pressure relief element 20 or 20a will maintain the chamber 10 at the same pressure as the outside environment, while not allowing any coolant to escape or outside air to enter.

Referring back to FIGS. 1, 2 and 6, in one embodiment, the chamber 10 can be made of an insulator (e.g., plastic), so that electronics cannot short if it touches the chamber 10. In one embodiment, the pressure-relief element 20 or 20a can be made of any of various nonreactive solids.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A cooling apparatus comprising:
   a chamber including a coolant in a liquid phase disposed near one or more heat-generation objects, the coolant in the liquid phase dissipating heat from the one or more heat-generation objects to be converted from the liquid phase to a vapor phase upon the coolant in the liquid phase reaching a boiling temperature, the chamber including a condenser configured to condense heat from the coolant in the vapor phase and convert back the coolant in the vapor phase to the liquid phase, the condenser being submerged and surrounded by the coolant in the liquid phase before the coolant in the liquid phase reaches the boiling temperature; and
   a pressure-relief element having a conduit, a first end of which is submerged in the coolant in the liquid phase internal to the chamber and a second end of which is connected to atmosphere external to the chamber, the pressure relief element including a mobile barrier comprising a solid or liquid layer floating on the surface of the cooling fluid within the pressure relief element.

2. The cooling apparatus of claim 1, wherein the condenser condenses the coolant in the vapor phase back into the liquid phase at a fast enough rate that a percentage volume of the coolant in the vapor phase remains a predetermined fraction of a volume inside the chamber.

3. The cooling apparatus of claim 1, wherein the pressure-relief element is configured to pull a portion of the coolant in the liquid phase to an inside of the conduit from the chamber when a pressure of the coolant in the vapor phase exceeds a predetermined level.

4. The cooling apparatus of claim 3, wherein the pressure-relief element is configured to push the portion of the coolant in the liquid phase back to the chamber from the inside of the conduit when the pressure of the coolant in the vapor phase is below the predetermined level.

5. The cooling apparatus of claim 3, wherein the predetermined level is one atmospheric pressure.

6. The cooling apparatus of claim 1, wherein the conduit of the pressure-relief element forms an open-air channel between the coolant in the liquid phase and the atmosphere.

7. The cooling apparatus of claim 1, wherein a pressure of the coolant in the vapor phase inside the chamber is maintained at or below one atmospheric pressure.

8. The cooling apparatus of claim 1, wherein the coolant includes dielectric materials.

9. A cooled electronic system comprising:
   at least one electronics circuit board comprising one or more electronic components; and
   a cooling apparatus configured to cool the one or more electronic components,
   the cooling apparatus comprising:
   a chamber including coolant in a liquid phase disposed near the one or more electronic components, the coolant in the liquid phase dissipating heat from the one or more electronic components to be converted from the liquid phase to a vapor phase upon the coolant in the liquid phase reaching a boiling temperature, the chamber including a condenser configured to condense heat from the coolant in the vapor phase and convert back the coolant in the vapor phase to the liquid phase, the condenser being submerged and surrounded by the coolant in the liquid phase before the coolant in the liquid phase reaches the boiling temperature; and
   a pressure-relief element comprising a conduit, a first end of which is submerged in the coolant in the liquid phase internal to the chamber and a second end of which is connected to atmosphere external to the chamber, the pressure relief element including a mobile barrier comprising a solid or liquid layer floating on the surface of the cooling fluid within the pressure relief element.

10. The cooled electronic system of claim 9, wherein the condenser condenses the coolant in the vapor phase back into the liquid phase at a fast enough rate that a percentage volume of the coolant in the vapor phase remains a predetermined fraction of a volume inside the chamber.

11. The cooled electronic system of claim 9, wherein the pressure-relief element is configured to pull a portion of the coolant in the liquid phase to an inside of the conduit from the chamber when a pressure of the coolant in the vapor phase exceeds a predetermined level.

12. The cooled electronic system of claim 11, wherein the pressure-relief element is configured to push the portion of the coolant in the liquid phase back to the chamber from the inside of the conduit when the pressure of the coolant in the vapor phase is below the predetermined level.

13. The cooled electronic system of claim 11, wherein the predetermined level is one atmospheric pressure.

14. The cooled electronic system of claim 9, wherein the conduit of the pressure-relief element forms an open-air channel between the coolant in the liquid phase and the atmosphere.

\* \* \* \* \*